United States Patent
Chen et al.

(10) Patent No.: US 6,929,998 B2
(45) Date of Patent: Aug. 16, 2005

(54) METHOD FOR FORMING BOTTLE-SHAPED TRENCH

(75) Inventors: Yi-Nan Chen, Taipei (TW); Hsin-Chuan Tsai, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/628,894

(22) Filed: Jul. 28, 2003

(65) Prior Publication Data

US 2004/0214390 A1 Oct. 28, 2004

(30) Foreign Application Priority Data

Apr. 23, 2003 (TW) .................................. 92109461 A

(51) Int. Cl.[7] ......................................... H01L 21/8242
(52) U.S. Cl. ................... 438/246; 438/249; 438/389; 438/255; 438/398
(58) Field of Search ................................ 438/243, 246, 438/249, 255, 386, 389, 398, 964, 558, 563

(56) References Cited

U.S. PATENT DOCUMENTS 6,455,369 B1 * 9/2002 Forster et al. ............... 438/249
2003/0153158 A1 * 8/2003 Ho et al. ..................... 438/386

OTHER PUBLICATIONS

Wolf et al., Silicon Processing for VLSI Era, Lattice Press, vol. 1, pp 56–58, 200, 242, 264 and 532.*

* cited by examiner

Primary Examiner—George Fourson
Assistant Examiner—Thanh V. Pham
(74) Attorney, Agent, or Firm—Quintero Law Office

(57) ABSTRACT

A method for forming a bottle-shaped trench. A conductive layer surrounded by a doped layer is filled in a lower portion of a trench formed in a substrate. A doping region is formed in the substrate around the doped layer by a heat treatment. A collar silicon nitride layer is formed over an upper portion of the sidewall of the trench. The conductive layer and the doped layer are successively removed using the collar silicon nitride layer as a mask. The doping region is partially oxidized to form a doped oxide region thereon. The doped oxide region is removed to form a bottle-shaped trench. A conformable rugged polysilicon layer is formed in the lower portion of the bottle-shaped trench.

20 Claims, 5 Drawing Sheets

METHOD FOR FORMING BOTTLE-SHAPED TRENCH

BACKGROUND OF THE INVENTION

1. Field of the Invention

The present invention relates in general to a semiconductor process, more particularly, to a method for forming a bottle-shaped trench and a method for forming a bottle-shaped trench capacitor.

2. Description of the Related Art

Typically, the capacitors most widely used in dynamic random access memory (DRAM) comprise two conductive layers (electrode plates) having an insulating layer in between. The ability to store the electric charge of a capacitor depends on the thickness of the insulating layer, surface area of the electrode plate and the electrical characteristics of the insulation material.

Due to recent demand for reduced size of semiconductor elements, for enhancing integration of integrated circuits, the area of cells in a memory device must continuously be reduced to support a larger number of memory cells, thereby increasing integration. Meanwhile, the electrode plates of a capacitor in a memory cell must have a sufficiently large surface area to store adequate electrical charge.

Nevertheless, as the size of elements is continuously reduced, trench storage node capacitance of DRAM has also decreased. As a result, storage capacitance must be increased to maintain good operating performance in memory devices. Currently, the method for increasing storage capacitance for DRAMs increases the width of the bottom of the trench, thereby increasing surface area to form a bottle-shaped trench capacitor.

The above method is carried out by selective oxidation of the upper portion of a trench to form a collar oxide layer to protect the upper portion of the trench. Next, the lower portion of the trench is wet-etched to form a bottle-shaped trench having a greater diameter than the upper portion of the trench.

In a conventional process, a trench is formed by isotropic dry etching on a semiconductor substrate having a masking layer comprised of an oxide layer and an overlying nitride layer formed thereon. Next, a nitride layer, an oxide layer, polysilicon layer and another oxide layer are sequentially formed on the masking layer and the trench. Nevertheless, the multiple deposition steps further increase the complexity of the process, thus incurring high production costs and lengthening process time. Hence, a simplified process with high production yield for fabricating bottle-shaped trench capacitors is required. In addition, in order to accomplish next generation, high performance memory devices, a method for increasing capacitance of the bottle-shaped trench capacitors is also required.

SUMMARY OF THE INVENTION

Accordingly, an object of the present invention is to provide a novel method for forming a bottle-shaped trench capacitor, thereby simplifying the process and increasing capacitance of the bottle-shaped trench capacitor.

In order to achieve such objects and other advantages, in the invention, the substrate near the lower portion of the trench is partially oxidized and then the oxidized portion is removed to form a bottle-shaped trench having a greater diameter than the upper portion of the trench. Moreover, the invention utilizes a rugged polysilicon layer formed between the buried bottom plate and the capacitor dielectric layer, thereby increasing the surface area of the bottle-shaped trench.

According to the object of the invention, a method for forming a bottle-shaped trench is provided. First, a trench is formed in a substrate. A lower portion of the trench is filled with a conductive layer surrounded by a doped layer. A conformable silicon nitride layer is formed overlying the substrate and an upper portion of the inner surface of the trench to cover the conductive layer and the doped layer. A heat treatment is performed on the substrate to form a doping region therein and around the doped layer. The silicon nitride layer is anisotropically etched to form a collar silicon nitride layer over the upper portion of the sidewall of the trench. The conductive layer and the doped layer are successively removed using the collar silicon nitride layer as a mask to expose the surface of the doping region. The exposed doping region is partially oxidized to form a doped oxide region thereon. The doped oxide region is removed to form a bottle-shaped trench. A conformable rugged polysilicon layer is formed in the lower portion of the bottle-shaped trench.

Moreover, after the rugged polysilicon layer is formed, gas phase doping (GPD) is performed thereon.

Moreover, the doped layer can be arsenic silicate glass (ASG), and the insulating layer can be tetraethyl orthosilicate (TEOS) oxide.

Moreover, the heat treatment is performed at about 900 to 1100° C.

Still according to the object of the invention, a method for forming a bottle-shaped trench capacitor is provided. First, a substrate covered by a masking layer having an opening therein is provided. The substrate under the opening is etched to form a trench therein. A lower portion of the trench is filled with a polysilicon layer surrounded by a doped silicon oxide layer. A conformable silicon nitride layer is formed overlying the masking layer and an upper portion of the inner surface of the trench to cover the polysilicon layer and the doped silicon oxide layer. A heat treatment is performed on the substrate to form a doping region therein and around the doped silicon oxide layer to serve as a buried bottom plate. The silicon nitride layer is anisotropically etched to form a collar silicon nitride layer over the sidewall of the upper portion of the trench. The polysilicon layer and the doped silicon oxide layer are successively removed using the collar silicon nitride layer as a mask to expose the surface of the doping region. The exposed doping region is partially oxidized to form a doped oxide region thereon. The doped oxide region is removed to form a bottle-shaped trench. A conformable rugged polysilicon layer and a conformable capacitor dielectric layer are successively formed in the lower portion of the bottle-shaped trench. The lower portion of the bottle-shaped trench is filled with a first doped polysilicon layer to serve as a top plate. The collar silicon nitride layer is removed. A collar silicon oxide layer is formed over the upper portion of the sidewall of the bottle-shaped trench. The upper portion of the bottle-shaped trench is successively filled with a second doped polysilicon layer and a third doped polysilicon layer.

Moreover, after the rugged polysilicon layer is formed, gas phase doping (GPD) is performed thereon.

Moreover, the doped layer can be arsenic silicate glass (ASG), and the insulating layer can be tetraethyl orthosilicate (TEOS) oxide.

Moreover, the heat treatment is performed at about 900 to 1100° C.

Moreover, the exposed doping region is partially oxidized by rapid thermal oxidation (RTO).

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1A:
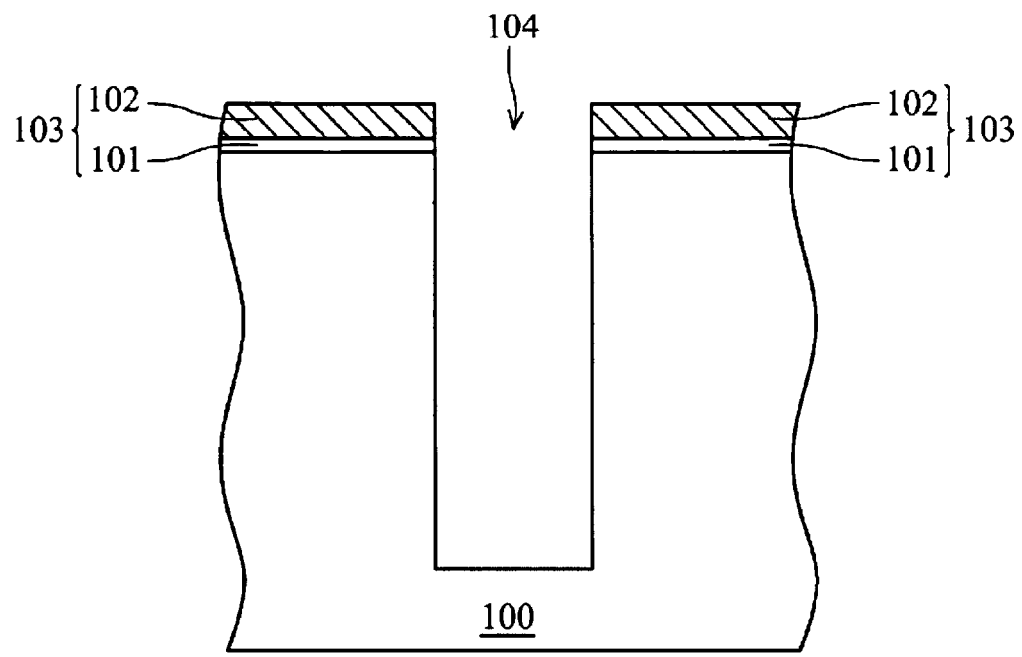
FIGS. 1a to 1j are cross-sections showing a method for forming a bottle-shaped trench capacitor according to the invention.

FIGS. 1a to 1j are cross-sections showing a method for forming a bottle-shaped trench capacitor in a memory device, such as a dynamic random access memory (DRAM). First, in FIG. 1a, a substrate 100, such as a silicon substrate, is provided. A mask layer 103 is formed on the substrate 100. The mask layer 103 can be composed of a pad oxide layer 101 and a thicker overlying silicon nitride layer 102. In this invention, the pad oxide layer 101 can be formed by thermal oxidation or conventional CVD. Moreover, the silicon nitride layer 102 overlying the pad oxide layer 101 can be formed by LPCVD.

Next, a plurality of openings is formed in the masking layer 103 by conventional lithography and etching. Thereafter, anisotropic etching, such as reactive ion etching (RIE), is performed on the substrate 100 using the masking layer 103 as an etch mask to form a plurality of trenches therein. In order to simplify the diagram, only one trench 104 is shown.

Figure 1B:
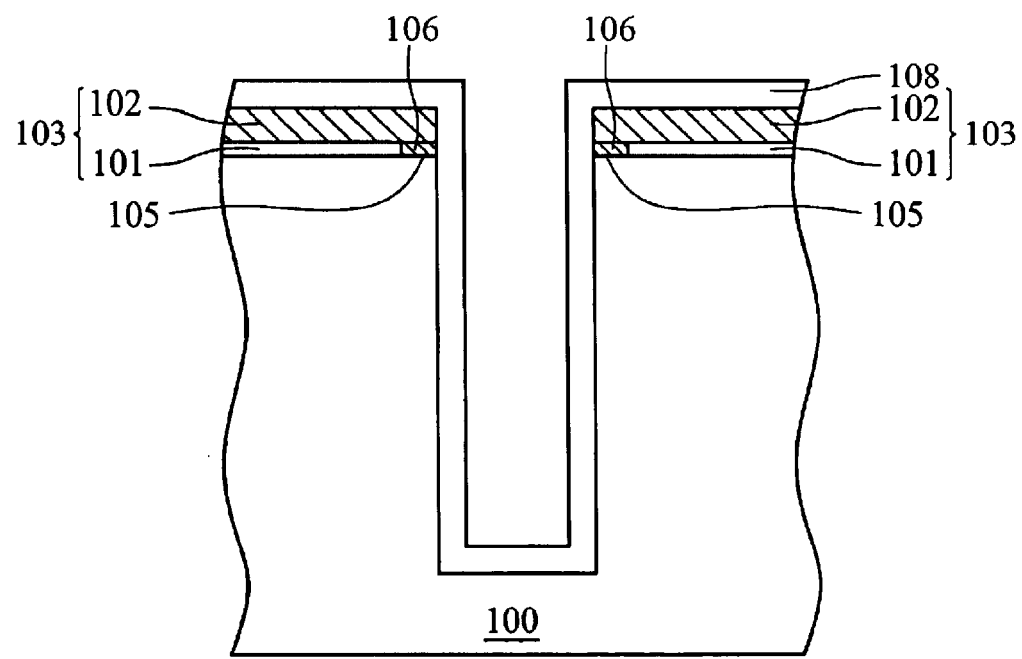

Next, in FIG. 1b, optionally, the pad oxide layer 101 is isotropically etched by buffer hydrofluoric (BHF) acid to form a recess 105 with a predetermined depth of about 15 to 40 Å. Next, silicon oxide 106 is filled into the recess 105 to protect the pad oxide layer 101 in the subsequent etching, thereby preventing silicon nitride layer 102 from peeling due to degraded adhesion.

Thereafter, a conformable insulating layer 108 is formed overlying the masking layer 103 and the inner surface of the trench 104 by conventional deposition, such as CVD. In the invention, the doped layer can be an arsenic-doped or arsenic silicate glass (ASG) layer, which has a thickness of about 200 to 400 Å.

Figure 1C:
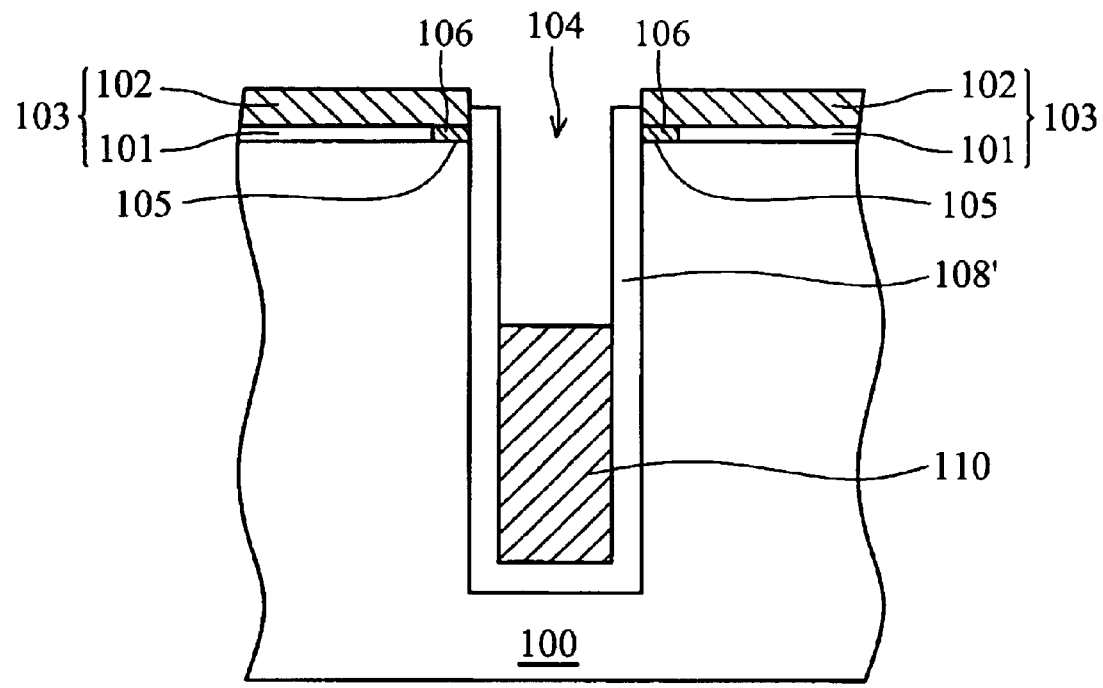

Next, in FIG. 1c, a conductive layer (not shown), such as a polysilicon layer, is deposited on the doped layer 108 and fills the trench 104 by conventional deposition, such as CVD. Subsequently, the excess conductive layer and doped layer 108 overlying the masking layer 103 are successively removed by polishing, such as chemical mechanic polishing (CMP) to leave a portion of conductive layer and doped layer 108'. Next, the remaining conductive layer in the trench 104 is further etched back to a predetermined depth of about 1 μm, thereby leaving a portion of conductive layer 110 in the lower portion of the trench 104.

Figure 1D:
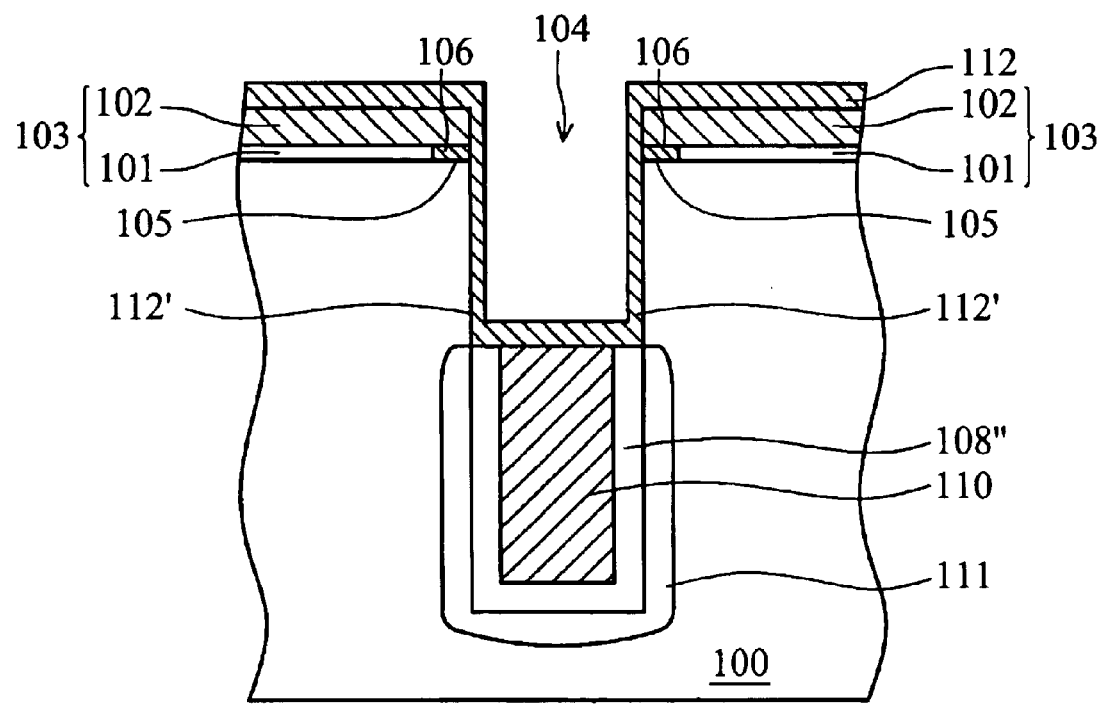

Next, in FIG. 1d, the doped layer 108' uncovered by the conductive layer 110 is removed to leave a portion of doped layer 108" surrounding the conductive layer 110 in the lower portion of the trench 104. Next, a conformable silicon nitride layer 112 is deposited overlying the masking layer 103 and the upper portion of the inner surface of the trench 104 by low-pressure CVD (LPCVD) to cover the conductive layer 110 and the doped layer 108". In the invention, the silicon nitride layer 112 has a thickness of about 300 to 400 Å.

Next, a heat treatment is performed on the substrate according to the FIG. 1d, thereby diffusing the dopant, such as arsenic, into the adjacent substrate 100 from the doped layer 108" by a drive-in process to form a doping region 111 therein. The doping region 111 is used as a buried bottom plate. In the invention, the heat treatment is performed at about 900 to 1100° C., and preferably 1050° C.

Figure 1E:
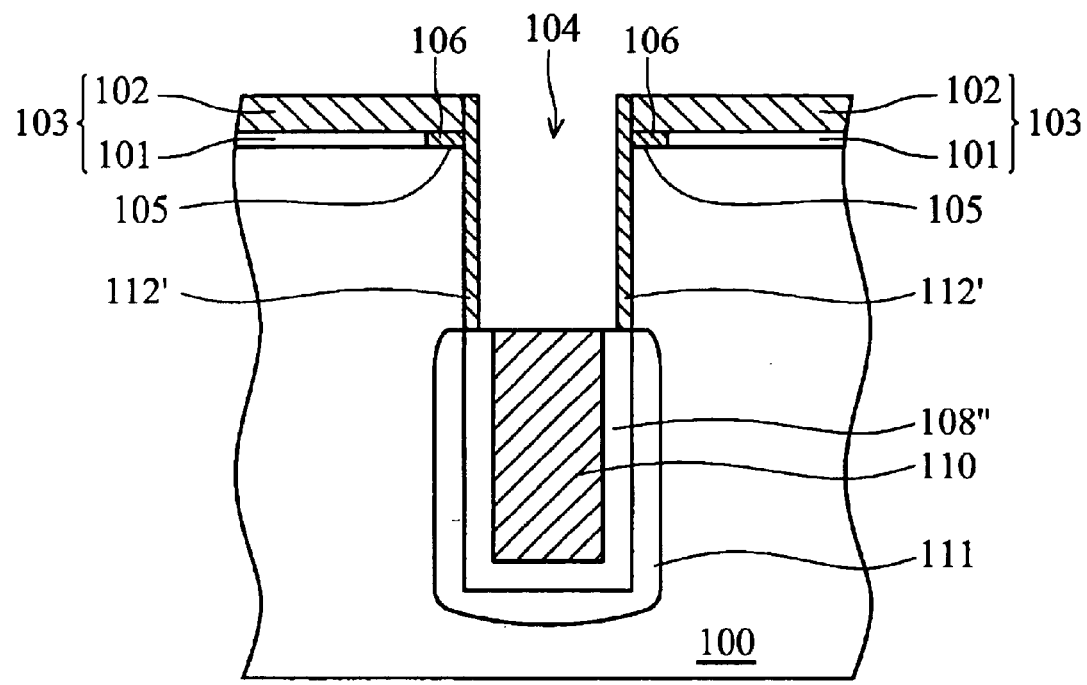

Next, in FIG. 1e, the silicon nitride layer 112 overlying the masking layer 103 and that in the bottom of trench 104 (overlying the conductive layer 110) are removed by anisotropic etching, such as RIE, to form a collar silicon nitride layer 112' over the sidewall of the upper portion of the trench 104 and expose the conductive layer 110.

Figure 1F:
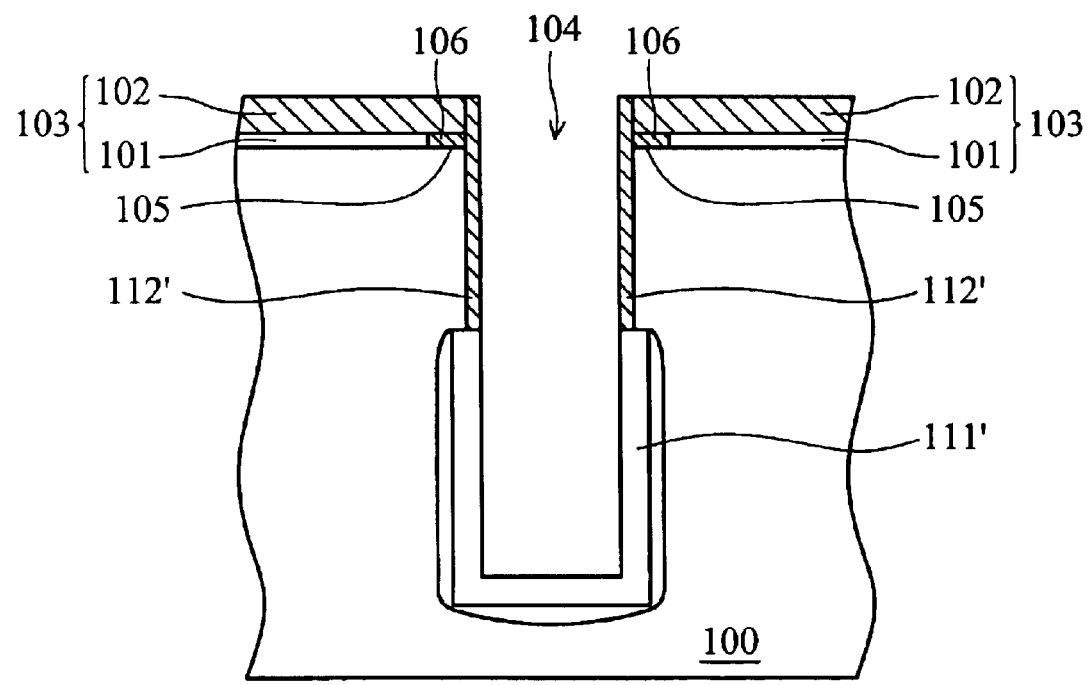

Next, in FIG. 1f, the conductive layer 110 and the doped layer 108" are successively removed using the collar silicon nitride layer 112' as an etch mask to expose the surface of the doping region 111. In the invention, the conductive layer 110 in the trench 104 is firstly removed by dry etching, and then the doped layer 108" is removed by vapor hydrofluoric (VHF) acid.

Subsequently, an oxidation, such as rapid thermal oxidation (RTO) is performed to partially oxidize the exposed doping region 111, so as to form a doped oxide region 111' thereon. In the invention, the oxidation is performed at about 900 to 1100° C. for 5 to 15 seconds.

Figure 1G:
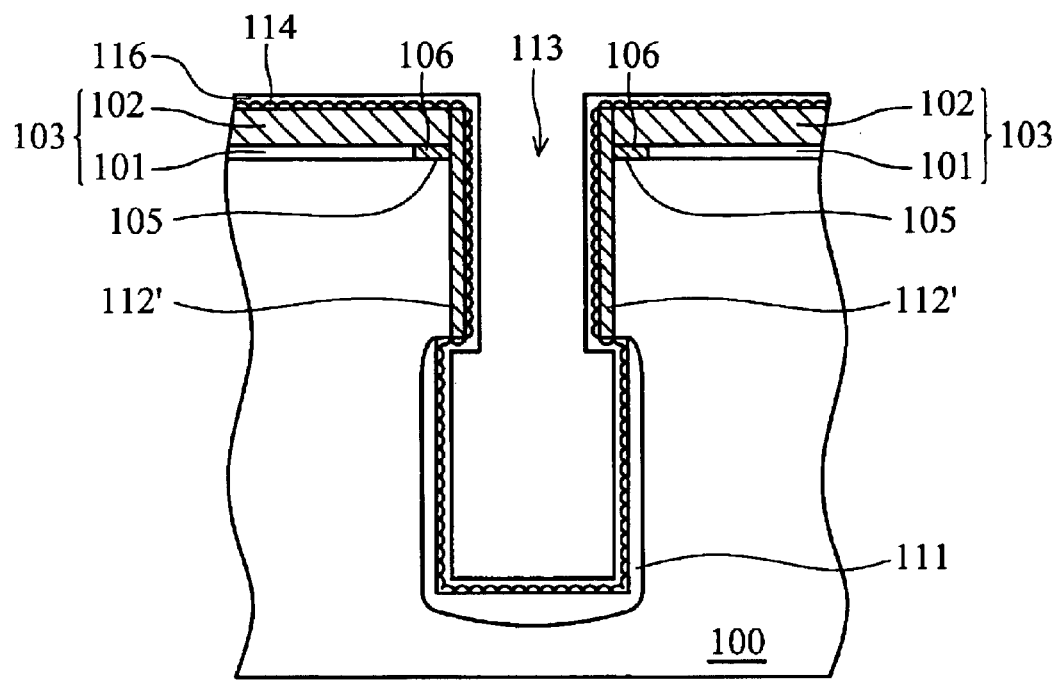

Next, in FIG. 1g, isotropic etching is performed using the collar silicon nitride layer 112' as an etch mask and using $NH_4OH$ as an etchant to remove the doped oxide region 111', thereby forming a bottle-shaped trench 113 having a greater diameter at the lower portion.

Next, a conformable rugged polysilicon (hemispherical grained silicon (HSG)) layer 114 is formed overlying the masking layer 103 and the inner surface of the bottle-shaped trench 113, thereby increasing the surface area of buried bottom plate 111. In the invention, the rugged polysilicon layer 114 can be formed by LPCVD at about 565 to 585° C. Thereafter, gas phase doping (GPD) is optionally performed on the rugged polysilicon layer 114 to reduce the concentration difference between the undoped collar silicon nitride layer 112' and the doped polysilicon layer 114. Next, a conformable dielectric layer 116 is formed over the rugged polysilicon layer 114 by, for example, LPCVD. In the invention, the dielectric layer 116 can be a doped silicon nitride layer or a silicon nitride/silicon oxide (NO) or silicon oxide/silicon nitride/silicon oxide (ONO) stacking layer.

Figure 1H:
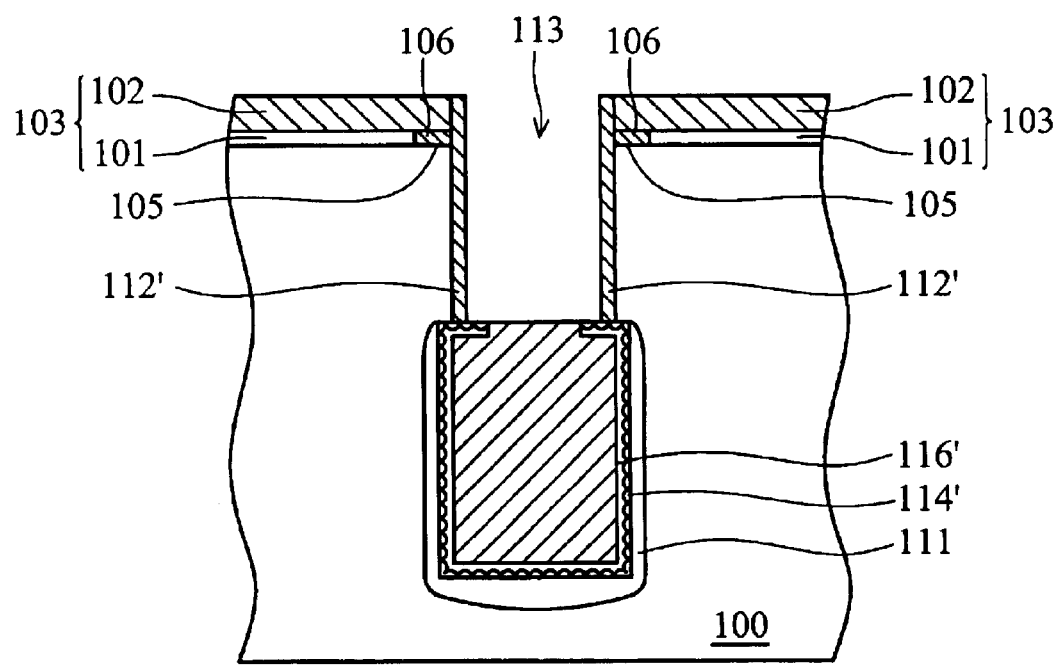

Next, in FIG. 1h, a conductive layer (not shown), such as a doped polysilicon layer, is formed overlying the masking layer 103 and fills the bottle-shaped trench 113 by conventional deposition, such as CVD. Subsequently, the conductive layer is etched to leave a portion of the conductive layer 118 in the lower portion of the bottle-shaped trench 113 to serve as a top plate. Thereafter, the uncovered dielectric layer 116 by the conductive layer 118 is removed by hot $H_3PO_4$ or other suitable solution to leave a portion of the dielectric layer 116' in the lower portion of the bottle-shaped trench 113 to serve as a capacitor dielectric layer. The rugged polysilicon layer 114 above the capacitor dielectric layer 116' is removed by RIE using the collar silicon nitride layer 112' as an etch stop layer to leave a portion of the rugged polysilicon layer 114' in the lower portion of the bottle-shaped trench 113, thereby completing the fabrication of the bottle-shaped trench capacitor 119 of the invention.

Figure 1I:
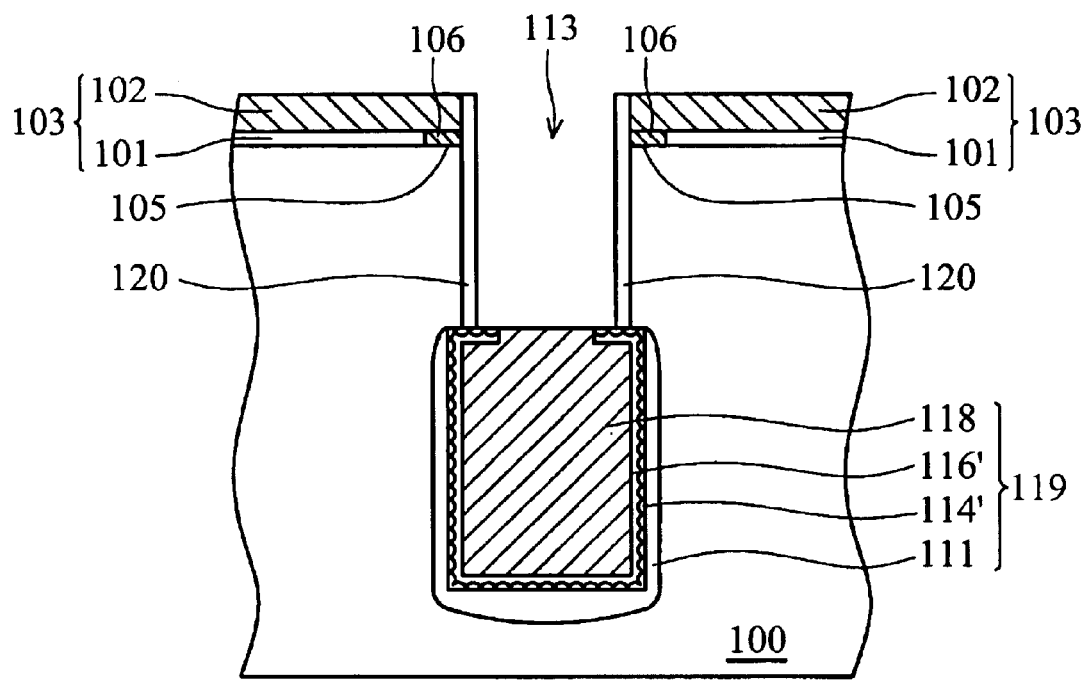

Next, in FIG. 1i, the collar silicon nitride layer 112' is removed by hot $H_3PO_4$ or other suitable solution. Thereafter, an insulating layer (not shown), such as a TEOS oxide layer is conformably formed overlying the masking layer 103 and the inner surface of the upper portion of the bottle-shaped trench 113 by conventional deposition, such as LPCVD. Next, the oxide layer over the trench 113 and that in the bottom of the trench 113 (overlying the trench capacitor 119) are removed by RIE to form a collar silicon oxide layer 120 over the sidewall of the upper portion of the trench.

Figure 1J:
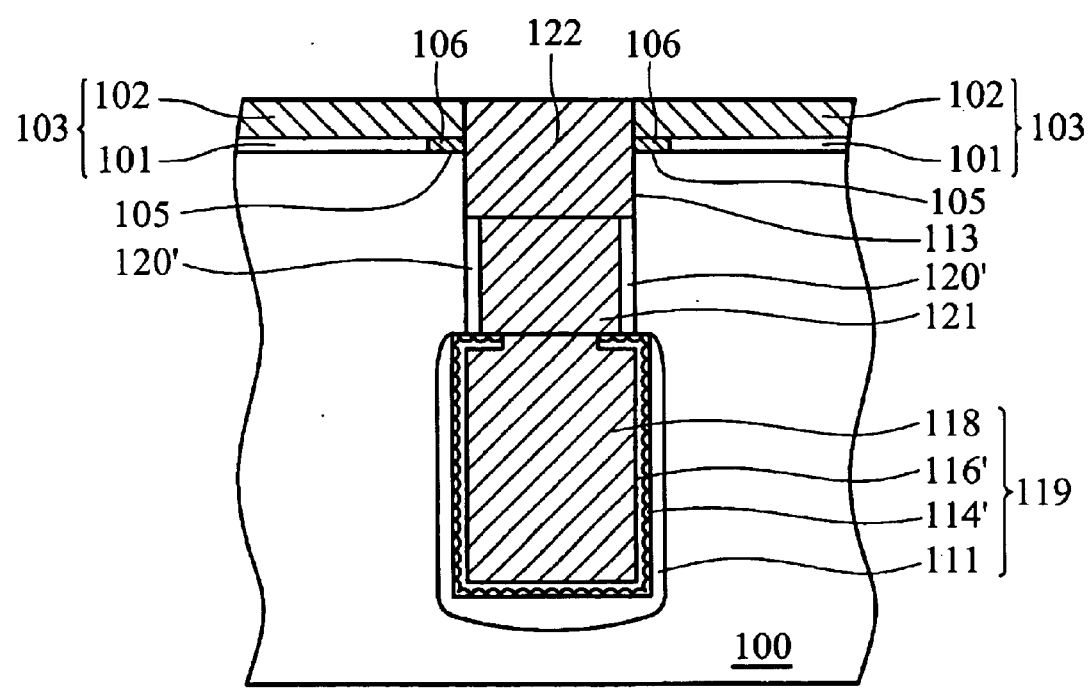

Finally, in FIG. 1j, a conductive layer (not shown), such as a doped polysilicon layer, is formed overlying the masking layer 103 and fills the upper portion of the bottle-shaped trench 113 (overlying the trench capacitor 119) by conventional deposition, such as CVD. Next, the conductive layer is etched to leave a portion of the conductive layer 121 only in the bottle-shaped trench 113 to serve as a first wiring layer. Next, the collar silicon oxide layer 120 uncovered by the first wiring layer 121 is removed to leave a portion of the collar silicon oxide layer 120'. Another conductive layer (not shown), such as a doped polysilicon layer, is subsequently formed overlying the masking layer 103 and fills the bottle-shaped trench 113. Next, the excess conductive layer over the bottle-shaped trench 113 is removed by polishing, such as CMP, to leave a portion of the conductive layer 122 overlying the first wiring layer 120 in the bottle-shaped trench 113 to serve as a second wiring layer.

According to the invention, the lower portion of the trench is partially oxidized and then the oxidized portion is removed to form the bottle-shaped trench with a greater diameter than the upper portion. Accordingly, the process for forming the bottle-shaped trench capacitor can be simplified, thereby increasing throughput and reducing fabrication cost. Moreover, the rugged polysilicon layer is additionally formed between the buried bottom plate and the capacitor dielectric layer, which can increase the surface area of the bottle-shaped trench, thereby increasing the capacitance of the bottle-shaped trench capacitor. That is, the performance of the memory device can be further enhanced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a bottle-shaped trench, comprising the steps of:
    forming a trench in a substrate;
    filling a lower portion of the trench with a conductive layer surrounded by a doped layer;
    forming a conformable silicon nitride layer overlying the substrate and an inner surface of an upper portion of the trench to cover the conductive layer and the doped layer;
    performing a heat treatment on the substrate to form a doping region therein and around the doped layer;
    anisotropically etching the silicon nitride layer to form a collar silicon nitride layer over the sidewall of the upper portion of the trench;
    successively removing the conductive layer and the doped layer using the collar silicon nitride layer as a mask to expose the surface of the doping region;
    partially oxidizing the exposed doping region to form a doped oxide region thereon;
    removing the doped oxide region to form a bottle-shaped trench; and
    forming a conformable rugged polysilicon layer in the lower portion of the bottle-shaped trench.

2. The method as claimed in claim 1, further performing a gas phase doping (GPD) after the rugged polysilicon layer is formed.

3. The method as claimed in claim 2, wherein the conductive layer is a polysilicon layer.

4. The method as claimed in claim 1, wherein the doped layer is an arsenic silicate glass (ASG) layer.

5. The method as claimed in claim 4, wherein the doped layer is removed by vapor hydrofluoric (VHF) acid.

6. The method as claimed in claim 5, wherein the silicon nitride layer has a thickness of about 300 to 400 Å.

7. The method as claimed in claim 1, wherein the heat treatment is performed at about 900 to 1100° C.

8. The method as claimed in claim 1, wherein the exposed doping region is partially oxidized by rapid thermal oxidation (RTO).

9. A method for forming a bottle-shaped trench capacitor, comprising the steps of:
    providing a substrate covered by a masking layer having an opening therein;
    etching the substrate under the opening to form a trench therein;
    filling a lower portion of the trench with a polysilicon layer surrounded by a doped silicon oxide layer;
    forming a conformable silicon nitride layer overlying the masking layer and an upper portion of the inner surface of the trench to cover the polysilicon layer and the doped silicon oxide layer;
    performing a heat treatment on the substrate to form a doping region therein and around the doped silicon oxide layer to serve as a buried bottom plate;
    anisotropically etching the silicon nitride layer to form a collar silicon nitride layer over the upper portion of the sidewall of the trench;
    successively removing the polysilicon layer and the doped silicon oxide layer using the collar silicon nitride layer as a mask to expose the surface of the doping region;
    partially oxidizing the exposed doping region to form a doped oxide region thereon;
    removing the doped oxide region to form a bottle-shaped trench;
    successively forming a conformable rugged polysilicon layer and a conformable capacitor dielectric layer in the lower portion of the bottle-shaped trench; and
    filling the lower portion of the bottle-shaped trench with a first doped polysilicon layer to serve as a top plate.

10. The method as claimed in claim 9, further comprising the steps of:
    removing the collar silicon nitride layer;
    forming a collar silicon oxide layer over the upper portion of the sidewall of the bottle-shaped trench; and
    successively filling the upper portion of the bottle-shaped trench with a second doped polysilicon layer and a third doped polysilicon layer.

11. The method as claimed in claim 9, wherein the masking layer is composed of a pad oxide layer and an overlying silicon nitride layer.

12. The method as claimed in claim 11, before filling the polysilicon layer, further comprising the steps of:
    isotropically etching the pad oxide layer to form a recess with a predetermined depth; and
    filling the recess with silicon nitride.

13. The method as claimed in claim 12, wherein the predetermined depth is about 15 to 40 Å.

14. The method as claimed in claim 9, wherein the doped silicon oxide layer is an arsenic silicate glass (ASG) layer.

15. The method as claimed in claim 14, wherein the doped silicon oxide layer is removed by vapor hydrofluoric (VHF) acid.

16. The method as claimed in claim 9, wherein the silicon nitride layer has a thickness of about 300 to 400 Å.

17. The method as claimed in claim 9, wherein the heat treatment is performed at about 900 to 1100° C.

18. The method as claimed in claim 9, wherein the exposed doping region is partially oxidized by rapid thermal oxidation (RTO).

19. The method as claimed in claim 9, wherein the capacitor dielectric layer comprises a silicon nitride layer.

20. The method as claimed in claim 9, further performing a gas phase doping (GPD) after the rugged polysilicon layer is formed.

* * * * *